United States Patent [19]
Chen

[11] Patent Number: 5,518,949
[45] Date of Patent: May 21, 1996

[54] ELECTRICAL ISOLATION METHOD FOR DEVICES MADE ON SOI WAFER

[75] Inventor: Hengtien H. Chen, Hsin-Chu, Taiwan

[73] Assignee: Winbond Electronics Corporation, Hsin-Chu, Taiwan

[21] Appl. No.: 503,528

[22] Filed: Jul. 18, 1995

[51] Int. Cl.$^6$ .................................................. H04L 21/76
[52] U.S. Cl. ........................... 437/62; 437/35; 437/40; 437/41; 148/DIG. 150
[58] Field of Search ................ 437/35, 40 TFT, 437/40 TFI, 41 TFT, 41 TFI, 62; 148/DIG. 150

[56] References Cited

U.S. PATENT DOCUMENTS

| | | | |
|---|---|---|---|
| 4,753,896 | 6/1988 | Matloubian | 437/62 |
| 4,755,481 | 7/1988 | Faraone | 437/62 |
| 4,950,618 | 8/1990 | Sundaresan et al. | 437/40 TFT |
| 5,034,789 | 7/1991 | Black | 257/66 |
| 5,346,839 | 9/1994 | Sundaresan | 437/62 |

FOREIGN PATENT DOCUMENTS 0116846  4/1992  Japan ........................................ 437/35

*Primary Examiner*—Trung Dang
*Attorney, Agent, or Firm*—Ladas & Parry

[57] ABSTRACT

The present invention is related to an isolation method for SOI (Silicon on Insulator) devices on an SOI wafer having a silicon substrate, a buried dielectric layer formed on the silicon substrate and a silicon film layer formed on the buried dielectric layer. The method includes steps of: a) growing a first oxide layer on the SOI wafer; b) depositing a silicon nitride layer on the first oxide layer; c) defining a photoresist pattern on the resulting product to sere as a mask; d) etching portions of the silicon nitride layer, the first oxide layer and the silicon film layer according to the photoresist mask to obtain a silicon-film island region; e) laterally etching the silicon nitride layer above the silicon-film island region with an isotropic nitride etchant to cause a horizontal recess between the photoresist mask and the first oxide layer; f) removing the photoresist mask; g) growing a second oxide layer over side walls of the silicon-film island region to passirate defects over the side walls; h) proceeding a lapse angle ion-implantation to the side walls of the silicon-film island region; i) depositing a third oxide layer on the resulting product; j) etching back the third oxide layer to have the silicon nitride layer above the silicon-film island region exposed and to form oxide side-wall spacers against the side walls of the silicon-film island region; k) removing the silicon nitride layer; and l) etching the first oxide layer on the silicon-film island region and the top potions of the oxide side-wall spacers smoothened simultaneously.

13 Claims, 7 Drawing Sheets

5,518,949

ELECTRICAL ISOLATION METHOD FOR DEVICES MADE ON SOI WAFER

FIELD OF THE INVENTION

The present invention is related to an electrical isolation method, and more particularly to an electrical isolation method for devices made on an SOI wafer.

BACKGROUND OF THE INVENTION

Because the devices manufactured on SOI wafers possess the advantages of anti-radiation, latch-up immunity and high speed and moreover the development of the SOI wafers has obtained a great progress in recent years, the applications of the SOI waters in VLSI are more and more important.

In spite the natural electrical isolation between a device and its underneath substrate is provided by SOI wafers, the isolation between devices in the lateral direction, however, still has some problems unsolved.

Please refer to FIG. 1 which is an elevational cross-section view schematically showing an SOI wafer, on which a MOSFET device is constructed with a conventional isolation method. The layers shown in FIG. 1 include a silicon substrate 1, a buried dielectric layer 2, a silicon-film island region 3, a gate oxide layer 4 and a side-wall oxide layer 41 located between the silicon-film island region 3 and the polysilicon gate 5.

During the operation of such SOI MOSFET shown in FIG. 1, the corner 32 of the silicon-film receives the electric lines from both top gate and side-wall gate. Therefore, the threshold voltage of the parasitic corner transistor is smaller than that of the main transistor at top surface. The side wall 31 of the silicon island due to island definition etching not only concentrates thereon a higher density of surface charge, which may render the threshold voltage of the parasitic side-wall transistor lower, but also has a defective and damaged surface. As a result, potential leakage paths between the drain and the source are formed at the side wall 31 and the corner 32. An undesired high subthreshold current may be conducted between source and drain through this leakage path, when the main transistor is in "off" state, i.e. when the gate to source voltage is smaller than the top transistor threshold voltage.

SUMMARY OF THE INVENTION

An object of the present invention is to provide an electrical isolation method for the isolation between devices on an SOI wafer, which can reduce the current leakage at the side wall and the corner of the silicon island on an SOI wafer.

In accordance with the present invention, an electrical isolation method for devices on an SOI (Silicon on Insulator) wafer having a silicon substrate, a buried dielectric layer formed on the silicon substrate and a silicon film layer formed on the buried dielectric layer includes steps of: a) forming a first oxide layer on the SOI wafer; b) forming a silicon nitride layer on the first oxide layer; c) defining a photoresist pattern on the resulting film stack to serve as an etching mask; d) etching portions of the silicon nitride layer, the first oxide layer and the silicon-film layer according to the photoresist mask to obtain a silicon-film island region; e) laterally etching the silicon nitride layer between the photoresist mask and the first oxide with an isotropic nitride etchant to cause a horizontal recess; f) removing the photoresist mask; g) forming a second oxide layer over side walls of the silicon-film island region to passivate the defects over the side walls; h) proceeding a large angle ion-implantation to the side walls of the silicon-film island region to increase the threshold voltage of the future built side-wall transistor; i) forming a third oxide layer over the resulting surface; j) etching back the third oxide layer to have the silicon nitride layer above the silicon-film island region exposed and to form side-wall spacers at the silicon-film island region edge; k) removing the silicon nitride layer; and l) etching the first oxide layer on the silicon-film island region and smoothing the top portions of the side-wall spacers simultaneously.

In accordance with another aspect of the present invention, a thickness of the first oxide layer is preferably about 200 Å. A thickness of the silicon nitride layer is preferably about 1500 Å.

In accordance with another aspect of the present invention, a thickness of the silicon film layer can be greater than about 2000 Å, or can be less than about 2000 Å in a condition that the isolation method further includes a step after the step d) of etching a part of the buried dielectric layer to make a summation of thicknesses of the first oxide layer, the silicon nitride layer, the silicon film layer and the etched dielectric layer equal to about 4000 Å.

In accordance with another aspect of the present invention, a magnitude of the horizontal recess between the photoresist mask and the first oxide layer is preferably about 1000 Å.

In accordance with another aspect of the present invention, a thickness of the second oxide layer is preferably about 200 Å. A thickness of the third oxide layer is preferably about 3000 Å. A horizontal thickness of each of the side-wall spacers is preferably about 2000 Å.

In accordance with another aspect of the present invention, an implating angle of the large angle implantation is preferably about 45°.

In accordance with another aspect of the present invention, the first and second oxide layers are formed by thermal growth, and the third oxide layer is formed by CVD deposition.

In accordance with another aspect of the present invention, the present electrical isolation method can be applied to a device fabrication process of a semiconductor on insulator structure.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The isolation method according to the present invention will be illustrated as follows with reference to FIGS. 2–12.

Figure 1:
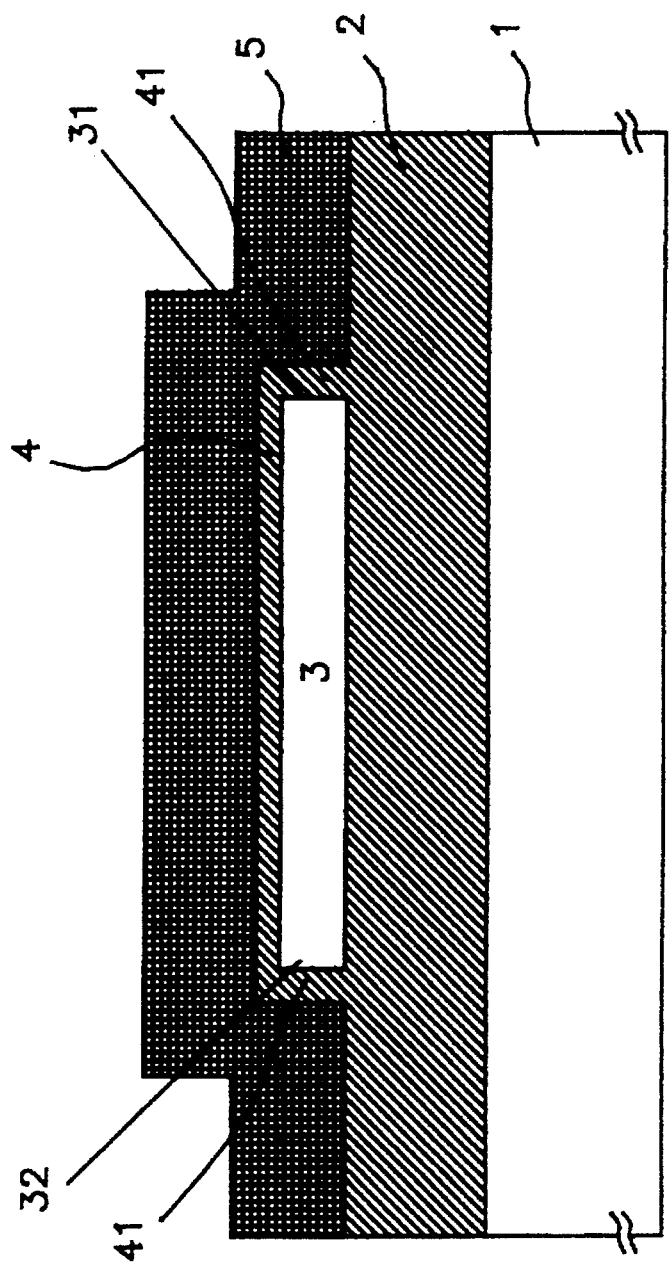
FIG. 1 is an elevational cross-section view schematically showing an SOI wafer and devices over the SOI wafer constructed with a conventional isolation method.
Figure 2:
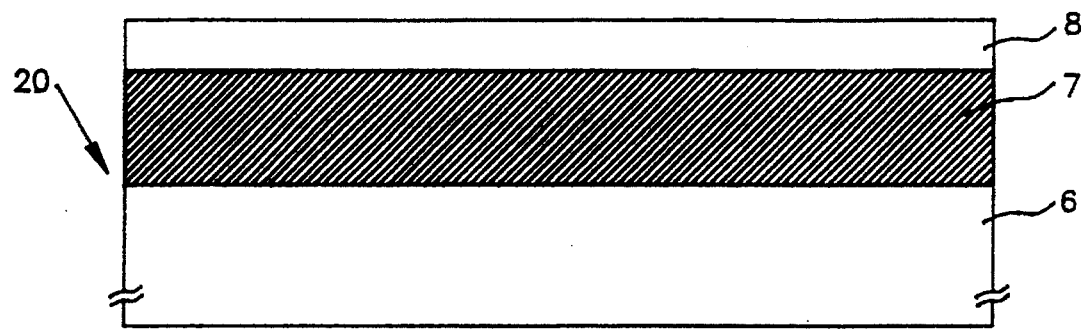
FIGS. 2–12 are elevational cross-section views schematically showing the resulting device over an SOI wafer during the construction process according to the present invention.

FIG. 2 shows a basic structure of an SOI wafer 20 including a silicon substrate 6, a buried dielectric layer 7 and a silicon film layer 8.

Of course, the construction on the SOI wafer for proceeding the present process depends on the desired product. For example, if the product to be manufactured is in CMOS structure, ion implantations and diffusion steps to form an N-well and a P-well should be executed in advance. The preceding steps for the desired products are well known to those skilled in the art, so they are not to be redundantly described here.

Figure 3:
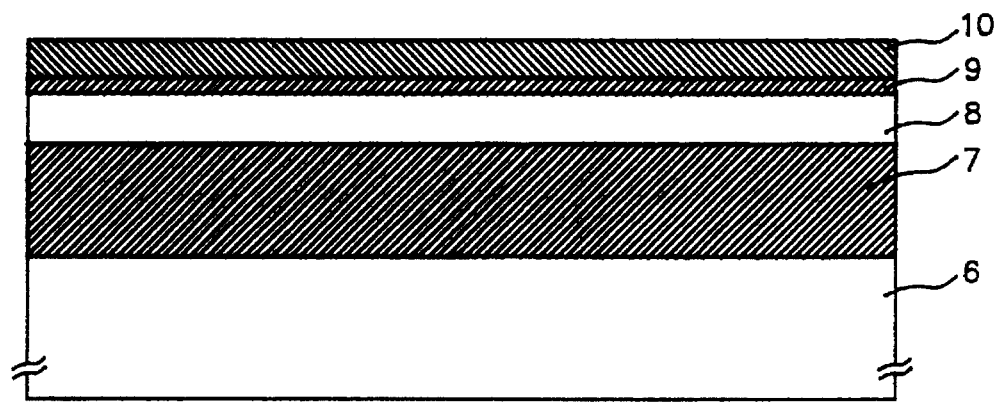
Figure 4:
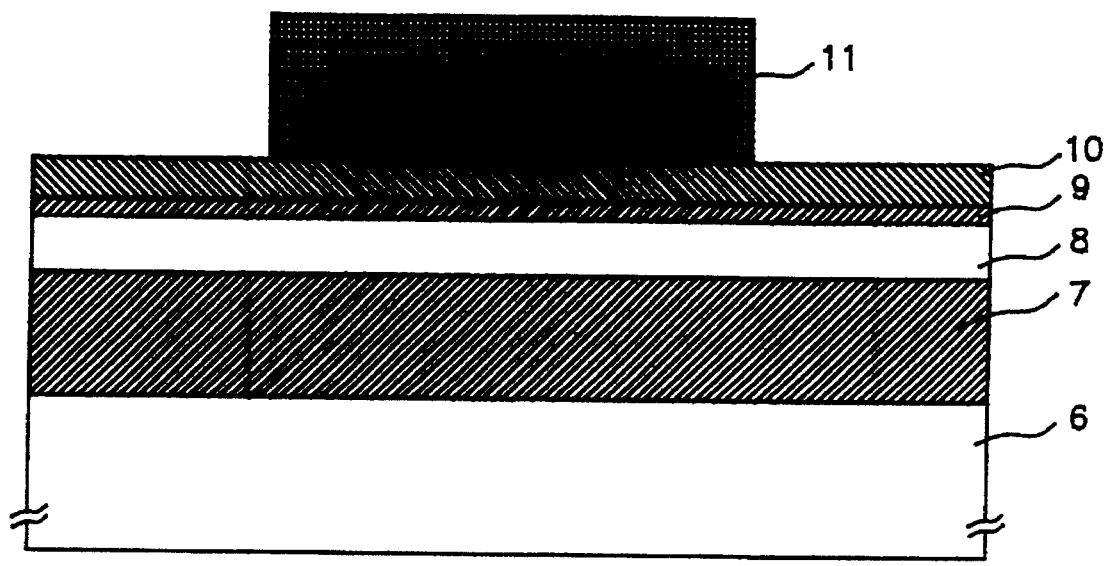
Figure 5:
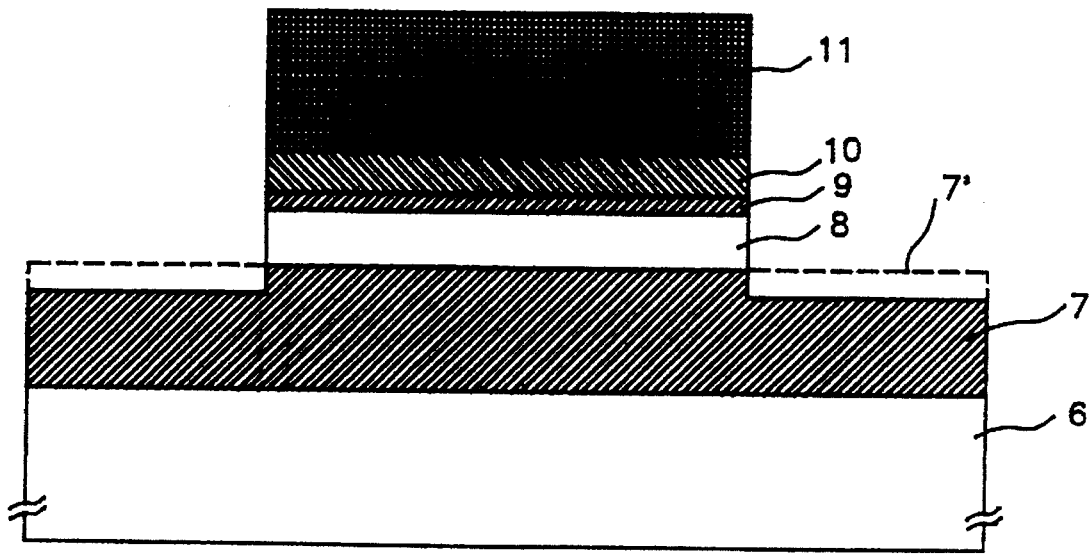
Figure 6:
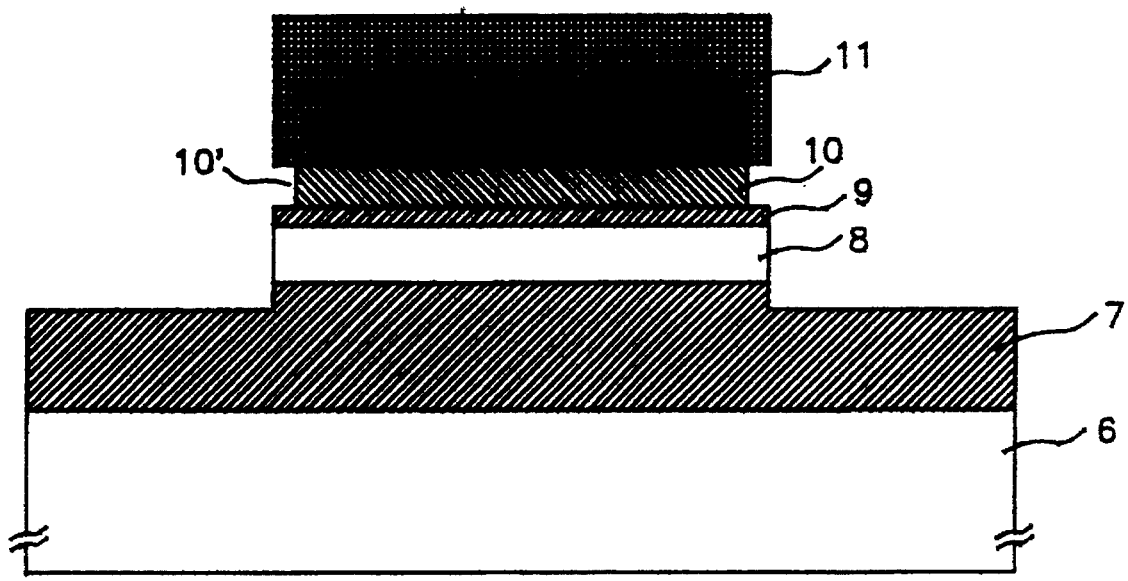
Figure 7:
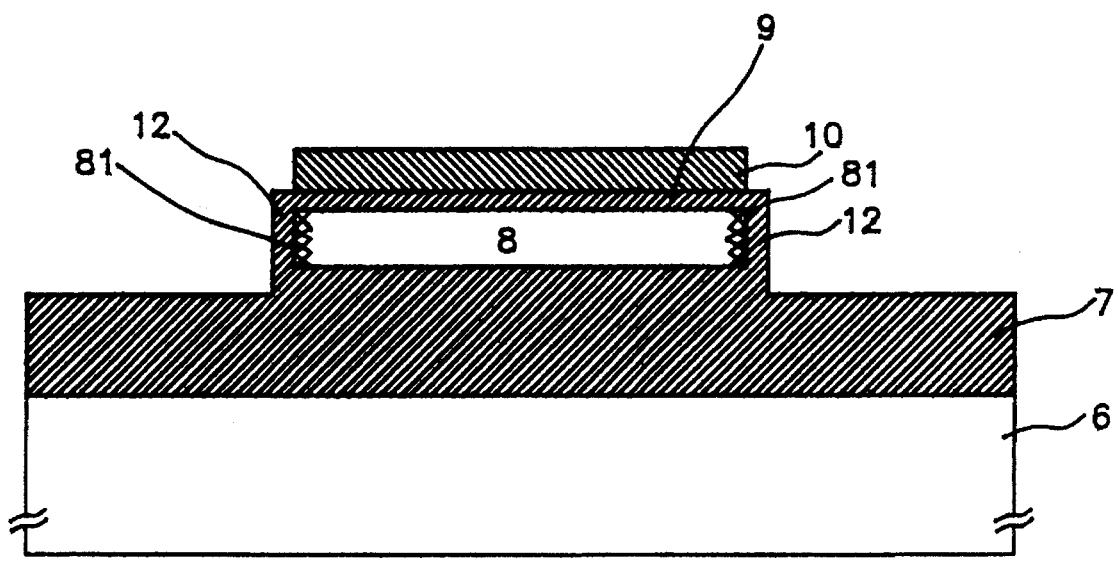

After the SOI wafer 20 is provided, an oxide layer 9 of about 200 Å is thermally grown on the silicon film layer 8 of the SOI wafer 20, and then a silicon nitride layer 10 of about 1500 Å is deposited on the oxide layer 9 by CVD technique, as shown in FIG. 3. A photoresist mask 11 is applied by the photolithography technique to provide a pattern on the silicon nitride layer 10 for proceeding the etching step, as shown in FIG. 4. When the thickness of the silicon film layer is greater than about 2000 Å, the silicon nitride layer 10, first oxide layer 9 and silicon film layer 8 are etched in the etching step to form silicon-film island region 8 according to the shape of the photoresist mask 11. If the thickness of the silicon film layer is less than about 2000 Å, part of the buried dielectric layer 7 has to be etched until the summation of thicknesses of the silicon nitride layer 10, the first oxide layer 9, the silicon film layer 8 and the etched dielectric oxide layer 7' is about 4000 Å. The thickness of the etched layers is determined in accordance with the width of the side-wall spacers formed in the following step. The smaller the summation of thicknesses of the silicon nitride layer 10, the first oxide layer 9 and the silicon film layer 8, the greater the width of the spacers formed thereafter. The situation shown in FIG. 5 is in a condition that the thickness of the silicon film layer 8 is less than about 2000 Å. Referring to FIG. 6, the silicon nitride layer 10 is laterally etched with an isotropic nitride etchant to cause a horizontal recess 10' of about 1000 Å between the photoresist mask 11 and the first oxide layer 9. The photoresist mask 11 is then removed, as shown in FIG. 7, and a second oxide layer 12 is thermally grown over the side walls 81 of the silicon-film island region 8. Large angle ion-implantation is executed to the side walls 81 of the silicon-film island region 8 at an angle of about 45° to increase the threshold voltage of the side-wall transistor thereof. If the silicon-film island region is p-type, the implanted ions can be BF$_2$, while if the silicon-film island region is n-type, the implanted ions can be As ions. Of course, if the present method is applied to a CMOS process, additional photolithography related steps are required.

Figure 8:
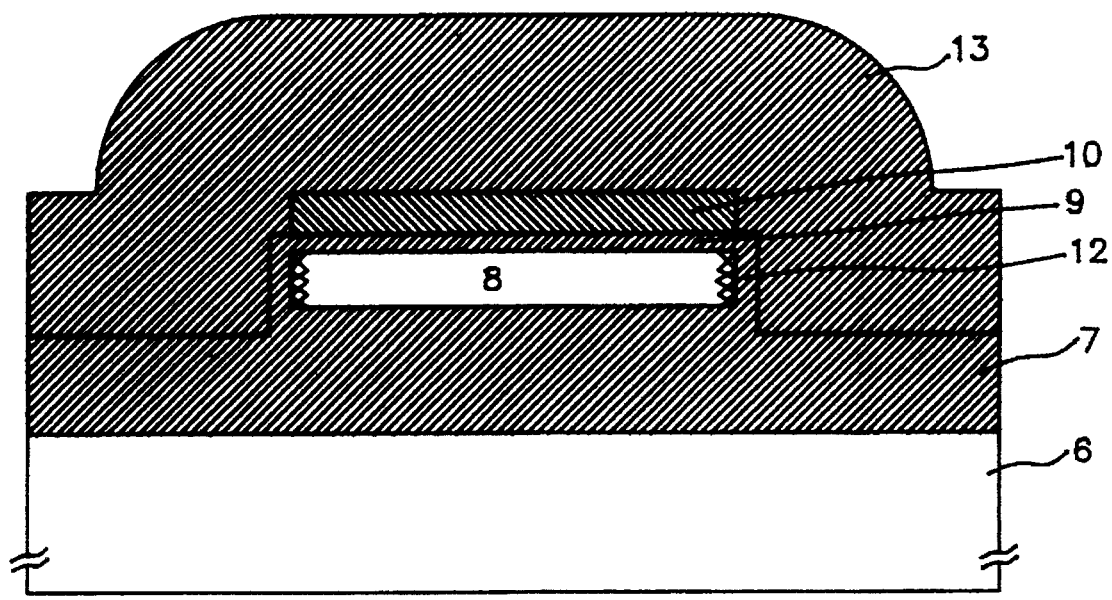
Figure 9:
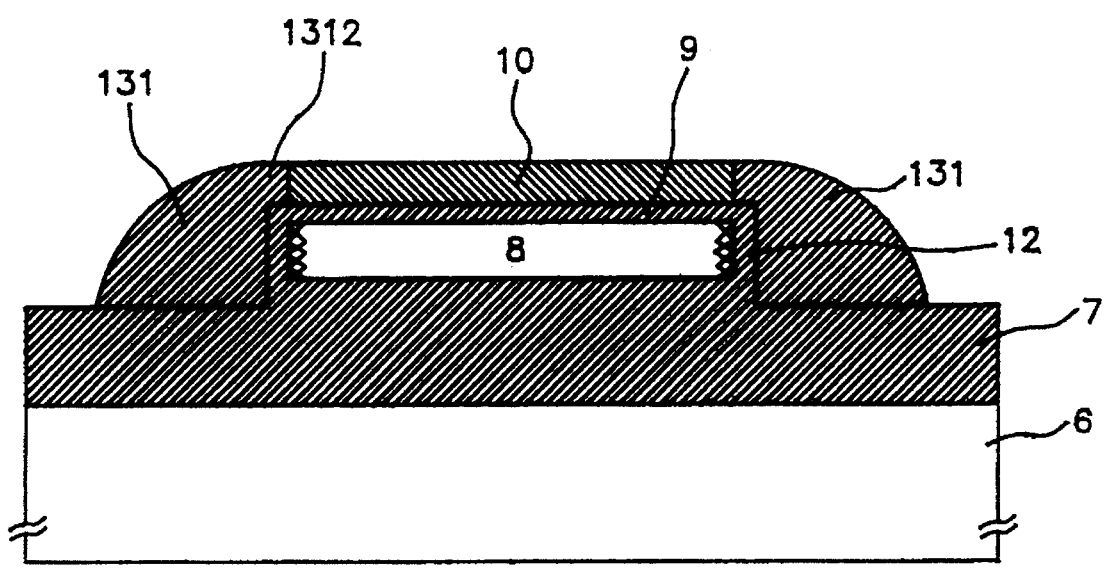
Figure 10:
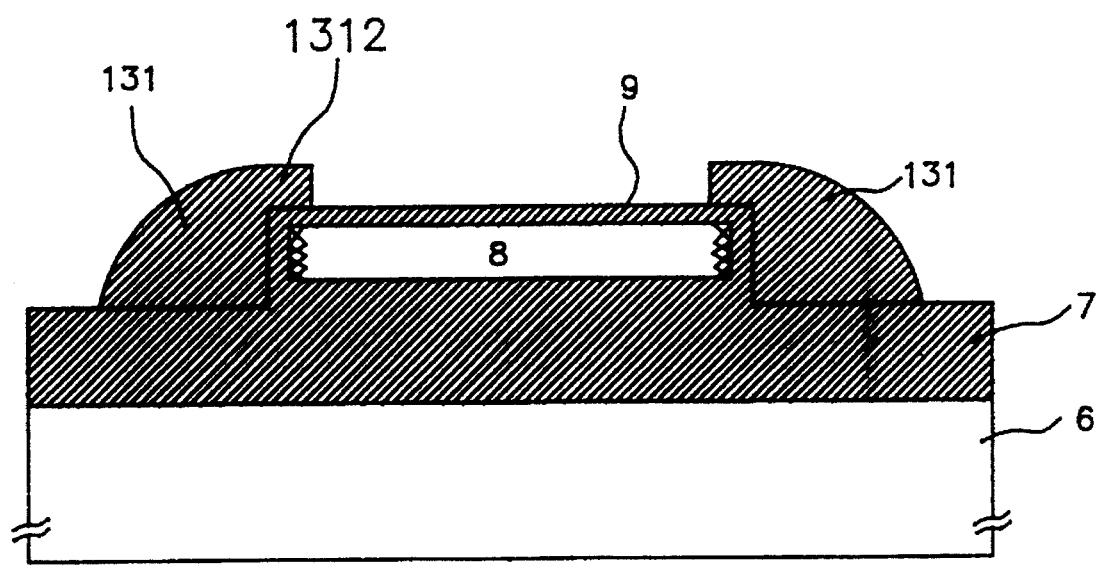
Figure 11:
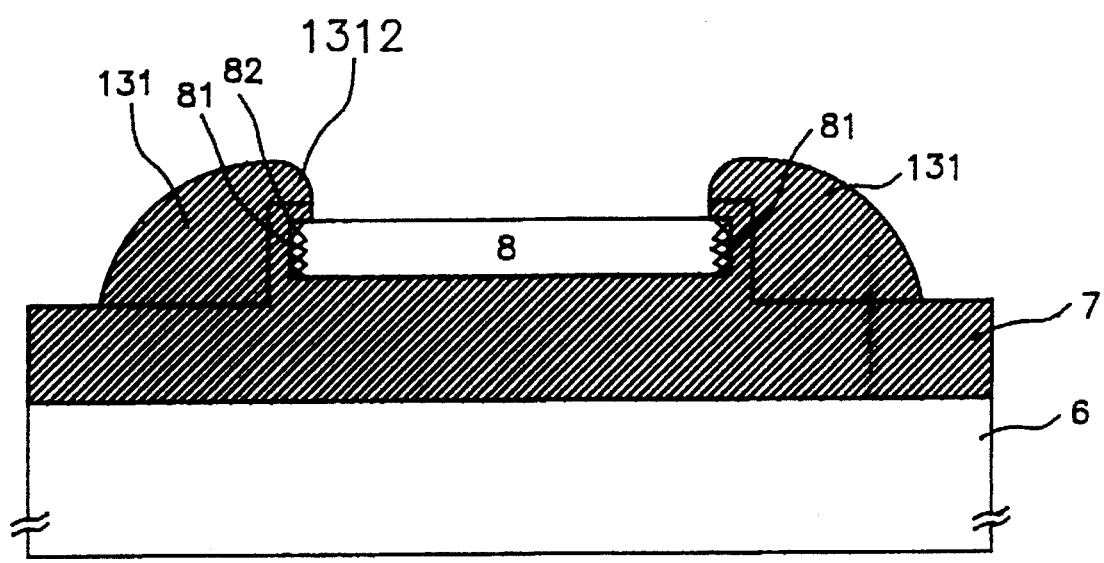

A third oxide layer 13 of about 3000 Å is provided by CVD technique afterwards, as shown in FIG. 8. The thicker the third oxide layer 13, the wider the side-wall spacers. The third oxide layer 13 is etched back until the silicon nitride layer 10 is exposed and the spacers 131 with a width of about 2000 Å is formed against the side walls 81 of the silicon film island region 8 (FIG. 9). The silicon nitride layer 10 is then removed by hot phosphoric acid (FIG. 10), and the first oxide layer 9 on the silicon-film island region 8 is etched by buffered oxide etching and the top 1312 of the oxide side-wall spacer 131 is smoothened. The smoothened spacer can avoid the polysilicon gate in later processing steps formed thereon from breaking.

Figure 12:
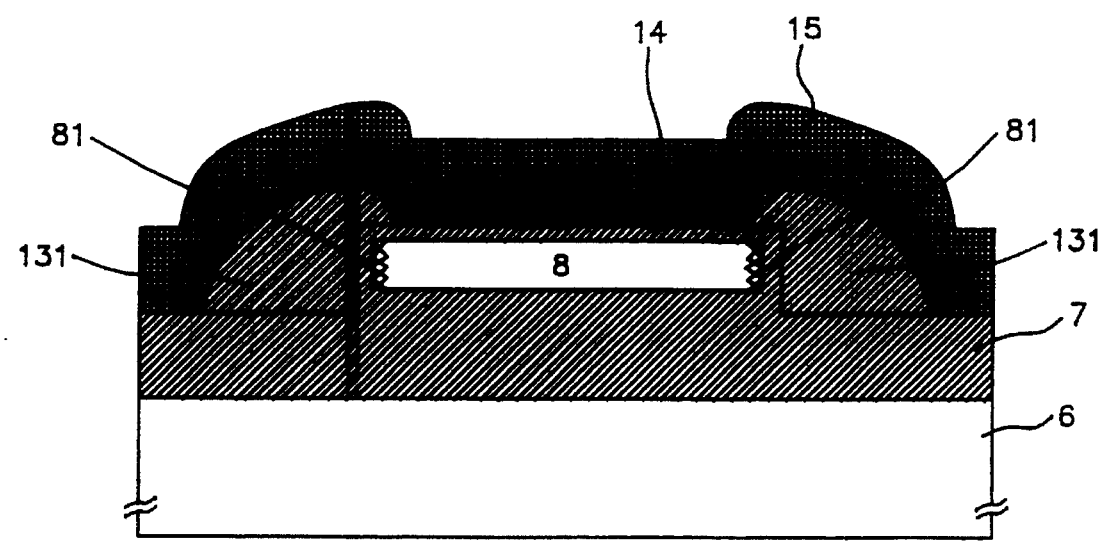

FIG. 12 shows the elevational cross-section view of the aforementioned layers, the gate oxide 14 and the polysilicon gate 15.

Of course, the method according to the present invention can be used for the isolation for those devices based on other silicon/insulator materials, such as the thin film transistor on SOS.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrical isolation method for devices on an SOI (Silicon on Insulator) wafer having a silicon substrate, a buried dielectric layer formed on said silicon substrate and a silicon film layer formed on said buried dielectric layer, comprising steps of:

a) forming a first oxide layer on said SOI wafer;

b) forming a silicon nitride layer on said first oxide layer;

c) defining a photoresist pattern on the resulting product to serve as mask;

d) etching portions of said silicon nitride layer, said first oxide layer and said silicon film layer according to said photoresist mask to obtain a silicon-film island region;

e) laterally etching said silicon nitride layer above said silicon-film island region with an isotropic nitride etchant to cause a horizontal recess between said photoresist mask and said first oxide layer;

f) removing said photoresist mask;

g) forming a second oxide layer over side walls of said silicon-film island region to passivate defects over said side walls;

h) proceeding a large angle ion-implantation to said side walls of said silicon-film island region;.

i) forming a third oxide layer on the resulting product;

j) etching back said third oxide layer to have said silicon nitride layer above said silicon-film island region exposed and to form oxide side-wall spacers against said side walls of said silicon-film island region;

k) removing said silicon nitride layer; and l) etching said first oxide layer on said silicon-film island region to smoothen top portions of said oxide side-wall spacers.

2. An electrical isolation method according to claim 1 wherein a thickness of said first oxide layer is about 200 Å.

3. An electrical isolation method according to claim 1 wherein a thickness of said silicon nitride layer is about 1500 Å.

4. An electrical isolation method according to claim 1 wherein a thickness of said silicon film layer is greater than about 2000 Å.

5. An electrical isolation method according to claim 1 wherein a thickness of said silicon film layer is less than about 2000 Å and said isolation method further comprises a step after said step d) of etching a part of said buried dielectric layer to make the summation of thicknesses of said first oxide layer, said silicon nitride layer, said silicon film layer and said etched buried dielectric layer equal to about 4000 Å.

6. An electrical isolation method according to claim 1 wherein a magnitude of said horizontal recess between said photoresist mask and said first oxide layer is about 1000 Å.

7. An electrical isolation method according to claim 1 wherein a thickness of said second oxide layer is about 200 Å.

8. An electrical isolation method according to claim 1 wherein an implating angle of said large angle implantaion is about 45°.

9. An electrical isolation method according to claim 1 wherein a thickness of said third oxide layer is about 3000 Å.

10. An electrical isolation method according to claim 1 wherein a horizontal thickness of each of said oxide sidewall spacers is about 2000 Å.

11. An electrical isolation method according to claim 1, wherein said first and second oxide layers are formed by thermal growth.

12. An electrical isolation method according to 1 wherein said third oxide layer is formed by CVD deposition.

13. An electrical isolation method according to claim 1 applied to a device fabrication process of a semiconductor on insulator structure.

* * * * *